(12) United States Patent
Liu et al.

(10) Patent No.: US 10,819,350 B2
(45) Date of Patent: Oct. 27, 2020

(54) CLOCK SIGNAL GENERATING CIRCUIT AND METHOD FOR GENERATING CLOCK SIGNAL

(71) Applicant: Realtek Semiconductor Corp., HsinChu (TW)

(72) Inventors: Hsi-En Liu, Kaohsiung (TW); Shawn Min, Hsinchu County (TW); You-Jyun Peng, Taipei (TW)

(73) Assignee: Realtek Semiconductor Corp., HsinChu (TW)

( * ) Notice: Subject to any disclaimer, the term of this patent is extended or adjusted under 35 U.S.C. 154(b) by 0 days.

(21) Appl. No.: 16/697,049

(22) Filed: Nov. 26, 2019

(65) Prior Publication Data

US 2020/0287554 A1    Sep. 10, 2020

(30) Foreign Application Priority Data

Mar. 5, 2019  (TW) .............................. 108107287 A (51) Int. Cl.
| | |
|---|---|
| *H03L 7/06* | (2006.01) |
| *H03L 7/08* | (2006.01) |
| *H03L 7/089* | (2006.01) |
| *H03L 7/093* | (2006.01) |
| *H03L 7/099* | (2006.01) |

(52) U.S. Cl.
CPC .......... *H03L 7/0893* (2013.01); *H03L 7/0895* (2013.01); *H03L 7/099* (2013.01)

(58) Field of Classification Search
CPC ...... H03L 7/0893; H03L 7/099; H03L 7/0895
See application file for complete search history.

(56) References Cited

U.S. PATENT DOCUMENTS

| | | | |
|---|---|---|---|
| 6,963,232 | B2 | 11/2005 | Frans |
| 7,202,718 | B2 * | 4/2007 | Lindner ................ H03L 7/0893 327/148 |
| 8,258,832 | B2 | 9/2012 | Min |
| 8,564,340 | B2 | 10/2013 | Liu et al. |
| 8,810,292 | B2 | 8/2014 | Katsushima |
| 10,476,511 | B2 * | 11/2019 | Hiraku .................. H03L 7/0995 |
| 2002/0075091 | A1 | 6/2002 | Lo et al. |
| 2006/0255864 | A1 | 11/2006 | Vandel |
| 2014/0021988 | A1 | 1/2014 | Zhang |

\* cited by examiner

*Primary Examiner* — Kenneth B Wells
(74) *Attorney, Agent, or Firm* — Winston Hsu (57) ABSTRACT

The present invention provides a clock generating circuit, wherein the clock generating circuit includes a phase detector, an integral path, a proportional path, a bias path and an oscillator. In the operations of the clock generating circuit, the phase detector generates a detection result according to a reference signal and a feedback signal, a first charge pump within the integral path generates a first control signal according to the detection result, a second charge pump within proportional path generates a second control signal according to the detection result, a low-pass filter within the bias path filters the first control signal to generate a third control signal, and the oscillator generates a clock signal according to the first control signal, the second control signal and the third control signal.

10 Claims, 8 Drawing Sheets

FIG. 8

CLOCK SIGNAL GENERATING CIRCUIT AND METHOD FOR GENERATING CLOCK SIGNAL

BACKGROUND OF THE INVENTION

1. Field of the Invention

The present invention relates a clock signal generating circuit.

2. Description of the Prior Art

A phase-locked loop (PLL) is a widely used circuit for generating a clock signal, which includes components such as a phase detector, a charge pump, a filter, and a voltage-controlled oscillator. Engineers can design currents of the charge pump current, a gain of the voltage-controlled oscillator and capacitance and resistance of the filter to make the PLL have different performance. However, design of the above parameters will greatly affect the area of the circuit and the noise of the signal. Therefore, how to propose circuit architecture with high degree of freedom for the parameter design and can suppress noise interference is an important issue.

SUMMARY OF THE INVENTION

It is therefore an objective of the present invention to provide a clock generating circuit with high degree of freedom for the parameter design and can suppress noise interference, to solve the above-mentioned problems.

In one embodiment of the present invention, a clock generating circuit is disclosed, wherein the clock generating circuit comprises a phase detector, an integral path, a proportional path, a bias path and an oscillator. In the operations of the clock generating circuit, the phase detector generates a detection result according to a reference signal and a feedback signal, a first charge pump within the integral path generates a first control signal according to the detection result, a second charge pump within proportional path generates a second control signal according to the detection result, a low-pass filter within the bias path filters the first control signal to generate a third control signal, and the oscillator generates a clock signal according to the first control signal, the second control signal and the third control signal.

In another embodiment of the present invention, a method for generating a clock signal is disclosed, wherein the method comprises the steps of: generating a detection result according to a reference signal and a feedback signal; using a first charge pump to generate a first control signal according to the detection result; using a second charge pump to generate a second control signal according to the detection result; performing a low-pass filtering operation upon the first control signal to generate third control signal; and using the first control signal, the second control signal and the third control signal to control an oscillator to generate the clock signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
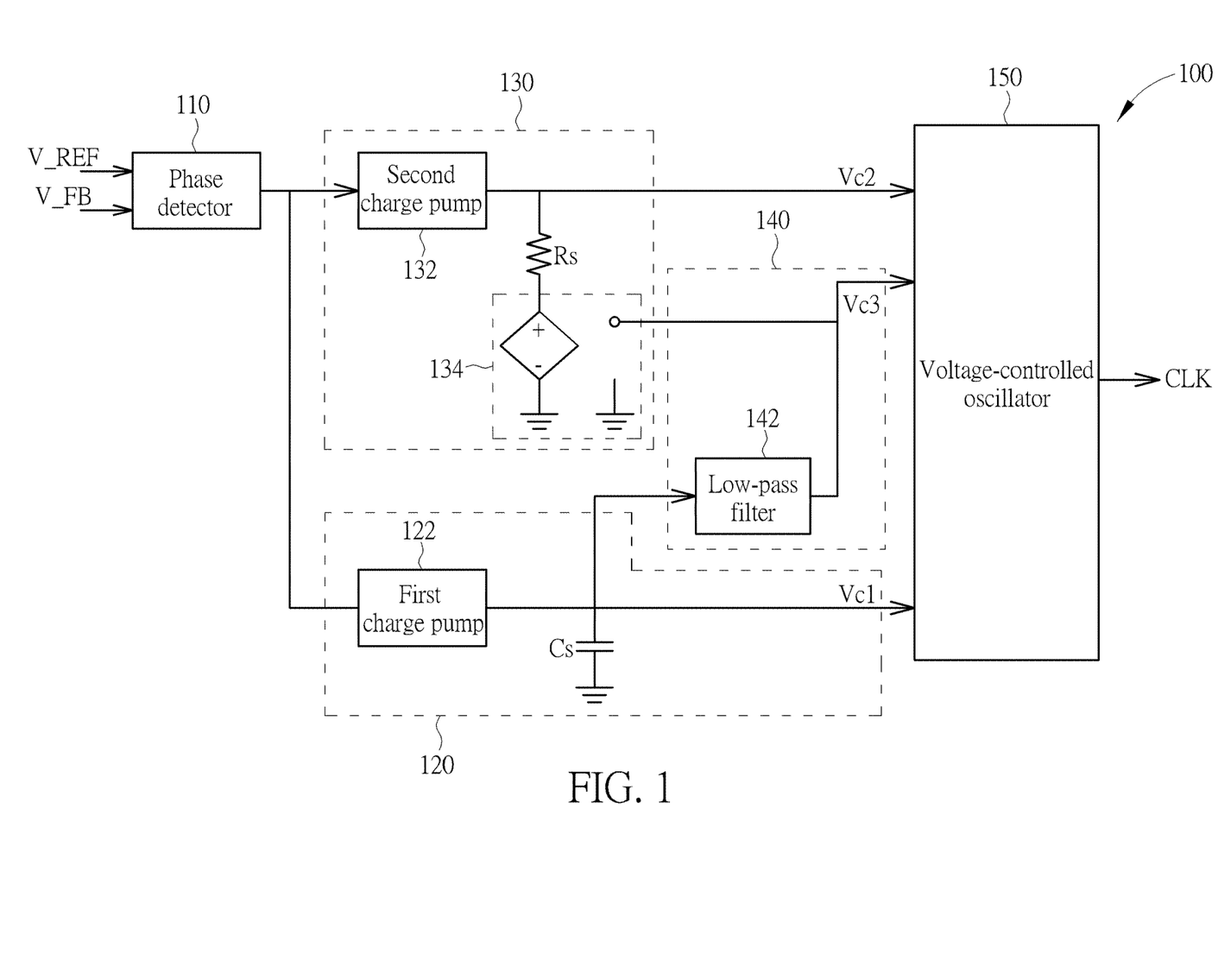
FIG. 1 is a diagram illustrating a PLL according to one embodiment of the present invention.

FIG. 1 is a diagram illustrating a PLL 100 according to one embodiment of the present invention. As shown in FIG. 1, the PLL 100 comprises a phase detector 110, an integral path 120, a proportional path 130, a bias path 140 and a voltage-controlled oscillator 150, wherein the integral path 120 comprises a first charge pump 122 and a capacitor Cs, the proportional path 130 comprises a second charge pump 132 and a voltage-controlled voltage source 134, and the bias path 140 comprises a low-pass filter 142.

In the basic operations of the PLL 100, the phase detector 110 compares a reference signal V_REF and a feedback signal V_FB to generate a detection result, wherein the reference signal V_REF may be a reference clock signal, and the feedback signal V_FB is generated according to a clock signal CLK outputted by the PLL 100, for example, the feedback signal V_FB is generated by using a frequency divider to divide the clock signal CLK. Then, the integral path 120, the proportional path 130 and the bias path 140 respond to the detection result to generate a first control signal Vc1, a second control signal Vc2 and a third control signal Vc3, respectively. Finally, the voltage-controlled oscillator 150 generates the clock signal CLK according to the first control signal Vc1, the second control signal Vc2 and the third control signal Vc3. In addition, because the main feature of the present invention is to control the voltage-controlled oscillator 150 by using the control signals of the three paths (i.e., the integral path 120, the proportional path 130, and the bias path 140), only the operations about the three paths are described in the following description.

In this embodiment, because the PLL itself is a proportional-integral system (2nd-order system), in order to increase the degree of freedom in loop design, the integral path 120 and the proportional path 130 are separately designed to achieve this goal. Regarding the operation of the integral path 120, the first charge pump 122 may respond to the detection result generated by the phase detector 110 in a past period of time (for example, the detection result generated by 5-10 clock cycles) to generate the first control signal Vc1. Regarding the operation of the proportional path 130, the second charge pump 132 can immediately generate the second control signal Vc2 according to the detection result currently generated by the phase detector 110.

In addition, in order to reduce a gain of the voltage-controlled oscillator 150 to avoid noise interference, the low-pass filter 142 in the bias path 140 can filter the first control signal Vc1 to filter out high frequency and noise components in the first control signal Vc1 to generate a third control signal Vc3. In one embodiment, the voltage-controlled voltage source 134 in the proportional path 130 can generate a low-frequency component of the second control signal Vc2 according to the third control signal Vc3.

Figure 2:
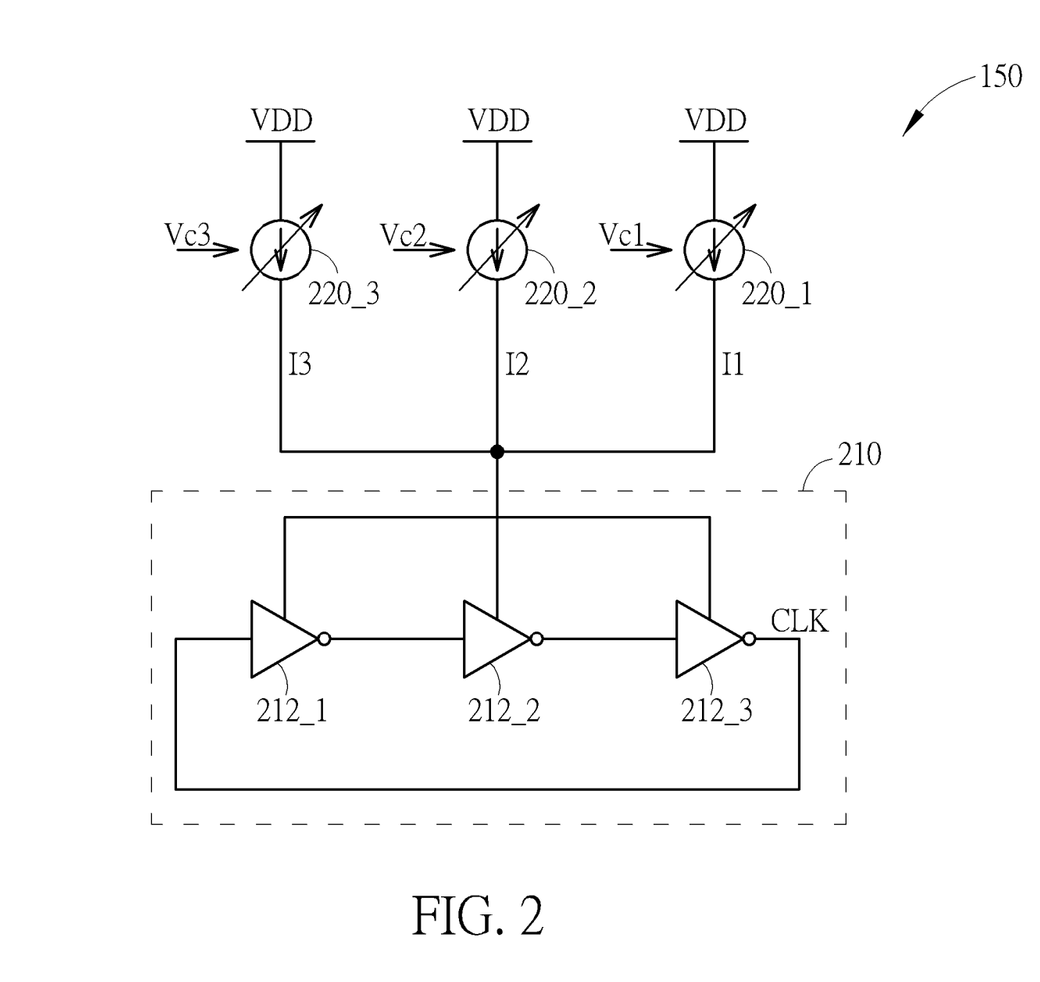
FIG. 2 is a diagram illustrating a voltage-controlled oscillator according to one embodiment of the present invention.

FIG. 2 is a diagram illustrating the voltage-controlled oscillator 150 according to one embodiment of the present invention. As shown in FIG. 2, the voltage-controlled oscillator 150 comprises three current sources (voltage-controlled current sources) 220_1-220_3 and an oscillating circuit 210, wherein the oscillating circuit 210 is a ring oscillator comprising three inverters 212_1, 212_2 and 212_3. During operation of the voltage-controlled oscillator 150, the current source 220_1 generates a first current I1 according to the first control signal Vc1, the current source 220_2 generates a second current I2 according to the second control signal Vc2, the current source 220_3 generates a third current I3 according to the third control signal Vc3, and the oscillating circuit 210 generates the clock signal CLK according to a summation of the first current I1, the second current I2 and the third current I3. It is noted that the circuit architecture of the voltage-controlled oscillator 150 shown in FIG. 2 is merely illustrative and not a limitation of the present invention. As long as the gain or the current of the voltage-controlled oscillator 150 is controlled by the first control signal Vc1, the second control signal Vc2 and the third control signal Vc3, the voltage-controlled oscillator 150 can be implemented by other circuit structures. For example, the voltage-controlled oscillator 150 can be implemented by an inductor-capacitor oscillator (LC tank), a ring oscillator with adjustable capacitive load (i.e. using the first control signal Vc1, the second control signal Vc2 and the third control signal Vc3 to adjust a variable capacitor), a ring oscillator with adjustable latch strength (latch type ring oscillator) (i.e. using the first control signal Vc1, the second control signal Vc2 and the third control signal Vc3 to adjust the latch strength), a ring oscillator with adjustable resistive load (i.e. using the first control signal Vc1, the second control signal Vc2 and the third control signal Vc3 to adjust a variable resistor), or any other appropriate oscillator. In other words, as long as the voltage-controlled oscillator 150 has three voltage-to-frequency converting units respectively controlled by the first control signal Vc1, the second control signal Vc2 and the third control signal Vc3, these alternative designs shall fall within the scope of the present invention.

As described above, because the integral path 120 and the proportional path 130 determine various important characteristics of the PLL 100, such as stability, bandwidth, system noise etc., by separating the configurations of the integral path 120 and the proportional path 130, the designer can adjust the gain of the voltage-controlled oscillator 150 (i.e., the ratio of the current sources 220_1, 220_2 and 220_3) in a more flexible way, and the designer can also adjust the currents provided by the first charge pump 122 and the second charge pump 132 to improve the design freedom of the circuit architecture. In addition, because the third control signal Vc3 is generated by low-pass filtering the first control signal Vc1 through the low-pass filter 142, it can be regarded as a coarse control signal close to a DC voltage with lower noise, so the gain of the voltage-controlled oscillator 150 is substantially controlled by fine adjustment (i.e., controlled by the first control signal Vc1 and the second control signal Vc2). Therefore, the target of reducing the gain of the voltage-controlled oscillator 150 can be achieved, and the voltage-controlled oscillator 150 can also maintain the original large frequency adjustment range. For example, the size or current of the current source 220_1~220_3 of the voltage-controlled oscillator 150 may be 1:1:8, that is, the third control signal Vc3 generated by the bias path 140 is responsible for the most gain of the voltage-controlled oscillator 150 to effectively reduce the gain of the voltage-controlled oscillator 150 controlled by the integral path 120 and the proportional path 130.

In the PLL 100 shown in FIG. 1, the voltage-controlled voltage source 134 responds to third control signal Vc3 to provide the DC voltage to an output terminal of the second charge pump 132 to adjust the DC voltage of the second control signal Vc2, wherein the DC voltage can be close to the third control signal Vc3, that is, the second control signal Vc2 can be regarded as changing in response to the third control signal Vc3 to control the current source 220_2. However, since the output terminal of the second charge pump 132 continuously has a current flowing out or flowing in, the voltage at the output terminal of the voltage-controlled voltage source 134 may be changed accordingly, thereby affecting the accuracy of the voltage. Therefore, the embodiment of FIG. 3 below can solve this problem through a special charge pump design.

Figure 3:
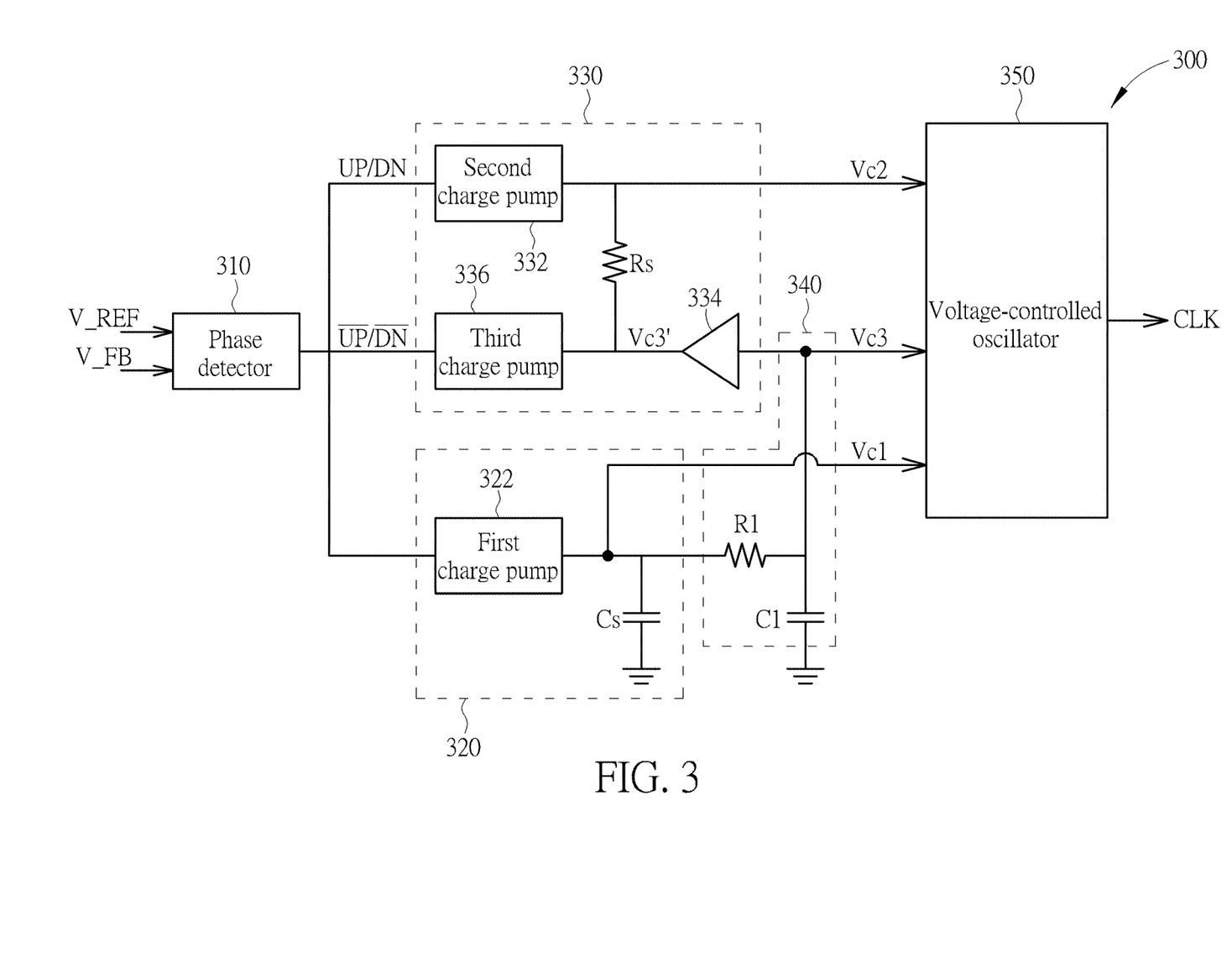
FIG. 3 is a diagram illustrating a PLL according to another embodiment of the present invention.

FIG. 3 is a diagram illustrating a PLL 300 according to another embodiment of the present invention. As shown in FIG. 3, the PLL 300 comprises a phase detector 310, an integral path 320, a proportional path 330, a bias path 340 and a voltage-controlled oscillator 350, wherein the integral path 320 comprises a first charge pump 322 and a capacitor Cs, the proportional path comprises a second charge pump 332, a buffer 334, a third charge pump 336 and a resistor Rs, and the bias path 340 comprises a low-pass filter having a resistor R1 and a capacitor C1.

In the embodiment shown in FIG. 3, because the phase detector 310, the integral path 320, the bias path 340 and the voltage controlled oscillator 350 operate the same as the phase detector 110, the integral path 120, the bias path 140, and the voltage controlled oscillator 150 shown in FIG. 1, the relevant details are not described again. For the proportional path 330, the buffer 334 can be a unity-gain operational amplifier for receiving the third control signal Vc3 to generate a buffered third control signal Vc3' serving as the DC voltage of the second control signal Vc2. In addition, the second charge pump 332 and the third charge pump 336 have the same current but different polarities, for example, the second charge pump 332 responds to an up signal UP and a down signal DN of the detection result to generate the current, and the third charge pump 336 responds to an inverted up signal $\overline{UP}$ and an inverted down signal $\overline{DN}$ to generate the current. In detail, if the second charge pump 332 responds to the detection result to output the current, this current will flow into the third charge pump 336 through the resistor Rs; and if the second charge pump 332 draws the current from the output terminal according to the detection result, the third charge pump 336 will output the current flowing into the second charge pump 332 through the resistor Rs. In the above case, the output terminal of the buffer 334 is at a virtual ground, so that the level of the buffered third control signal Vc3' is not affected by the second charge pump 332, and the second control signal Vc2 becomes more stable.

Figure 4:
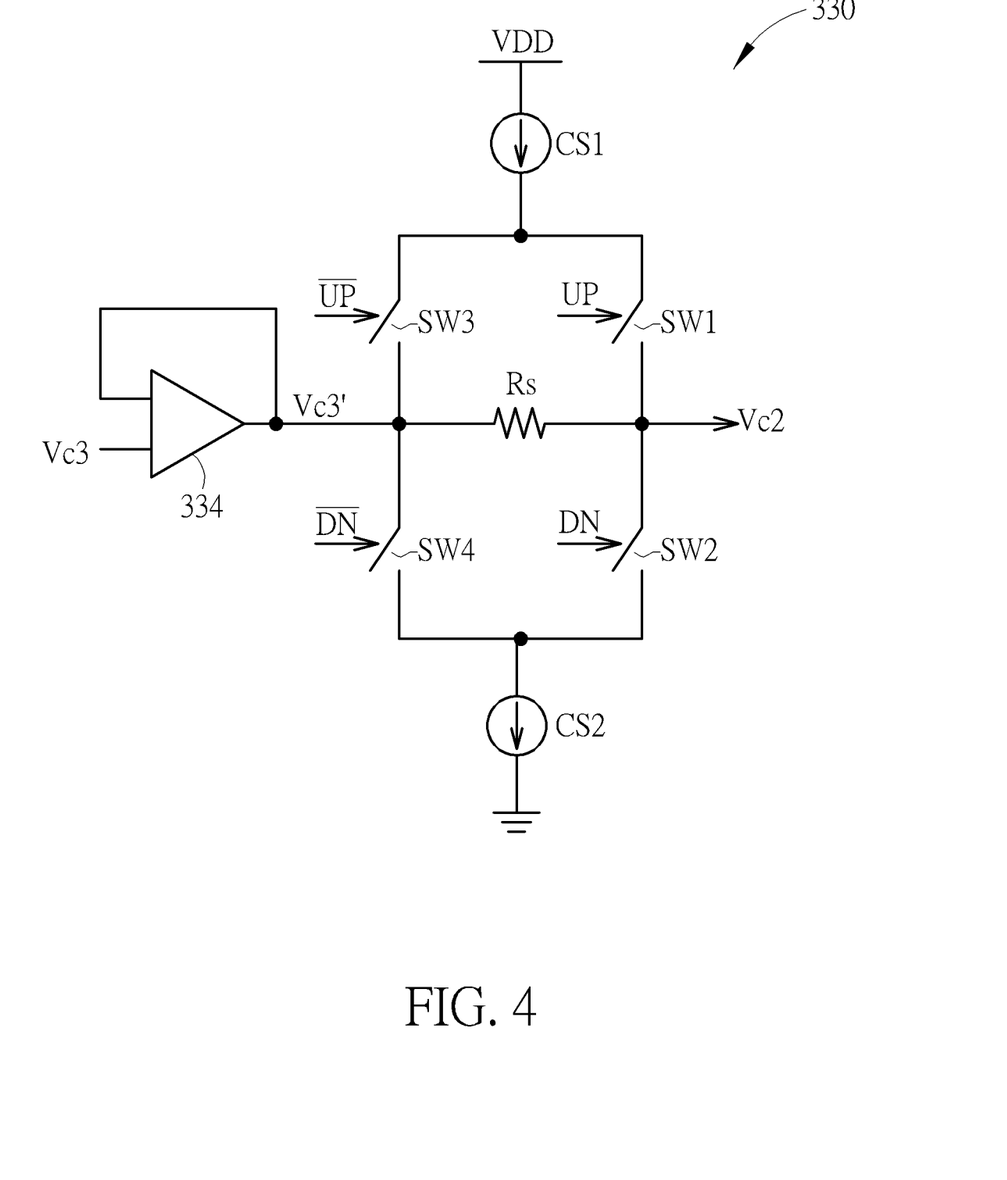
FIG. 4 is a diagram illustrating a proportional path according to one embodiment of the present invention.

FIG. 4 is a diagram illustrating the proportional path 330 according to one embodiment of the present invention. In this embodiment, the second charge pump 332 and the third charge pump 336 are implemented by two current sources CS1 and CS2 and three switches SW1-SW4 coupled between a supply voltage VDD and a ground voltage, wherein the switch SW1 is controlled by the up signal UP, the switch SW2 is controlled by the down signal DN, the switch SW3 is controlled by the inverted up signal $\overline{UP}$, the switch SW4 is controlled by the inverted down signal $\overline{DN}$, and the current source CS1 and CS2 provide the same amount of current. In the embodiment shown in FIG. 4, regardless of the logic value of the up signal UP and the down signal DN generated by the phase detector 310, the current generated by the second charge pump 332 and the third charge pump 336 does not flow through the output terminal of the buffer 334. Therefore, the voltage level of the buffered third control signal VC3' will not be influenced, and the stability of the second control signal Vc2 can be improved.

Figure 5:
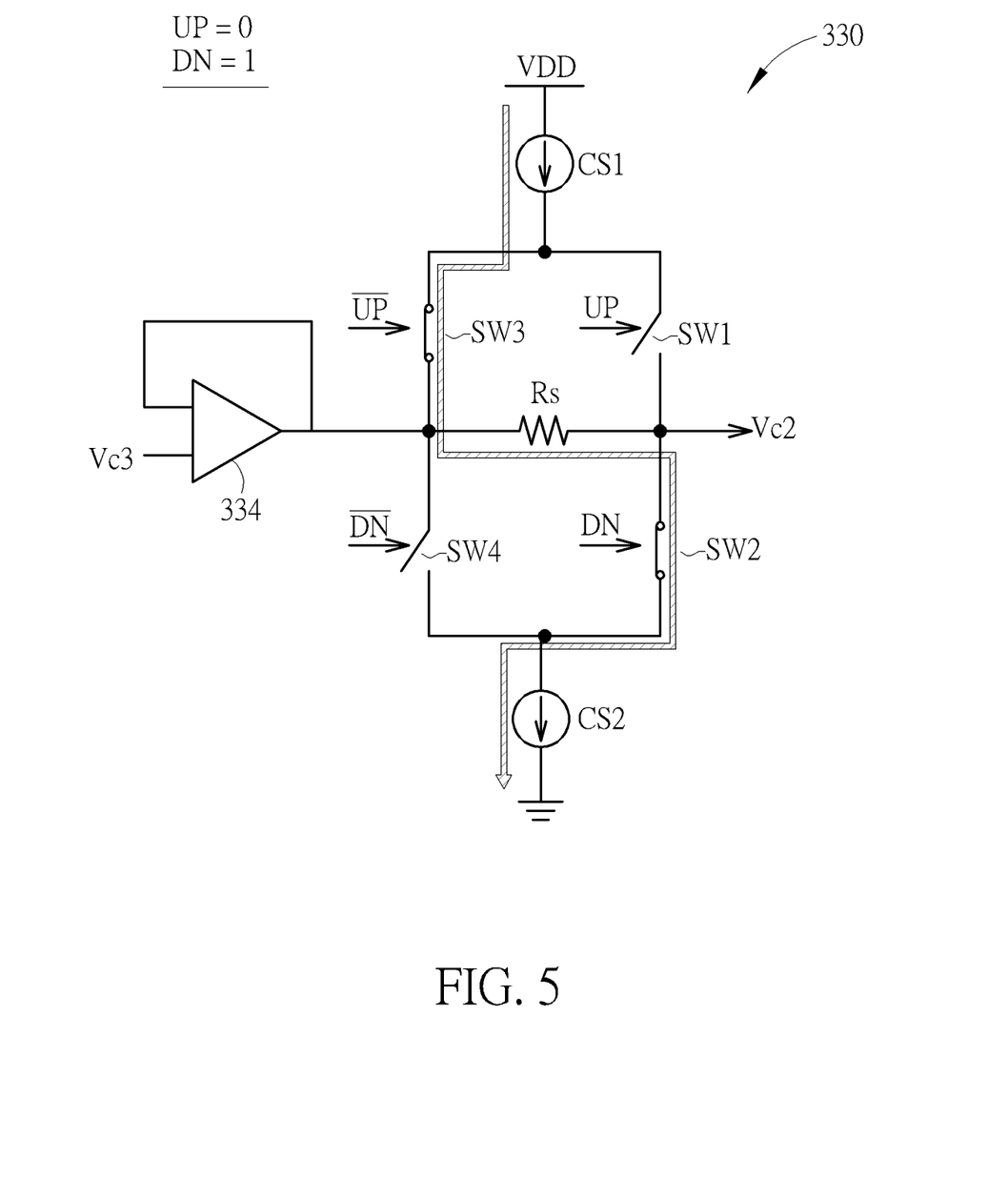
FIGS. 5-8 show current paths of the proportional path having different up signals and down signals.
Figure 6:
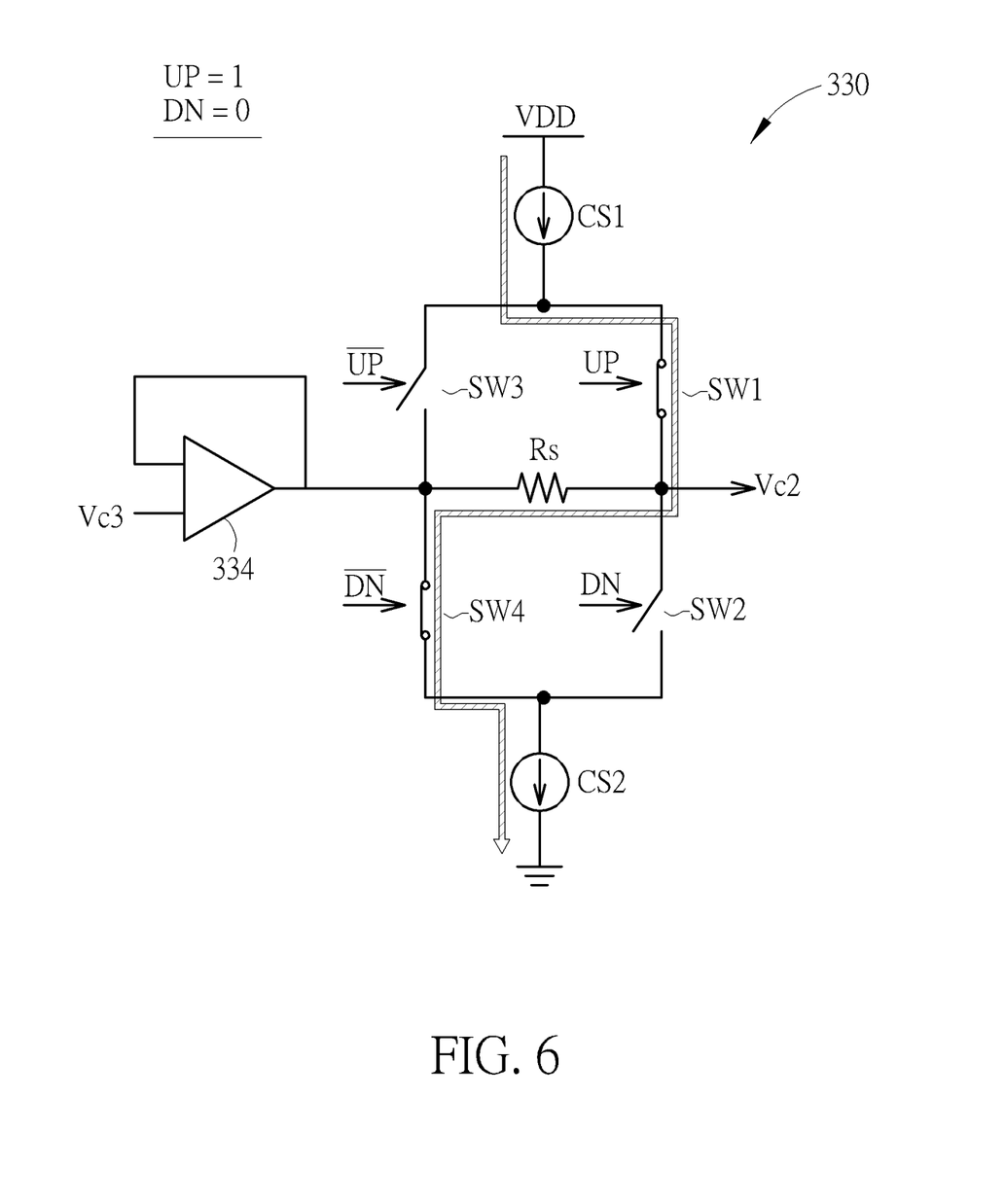
Figure 7:
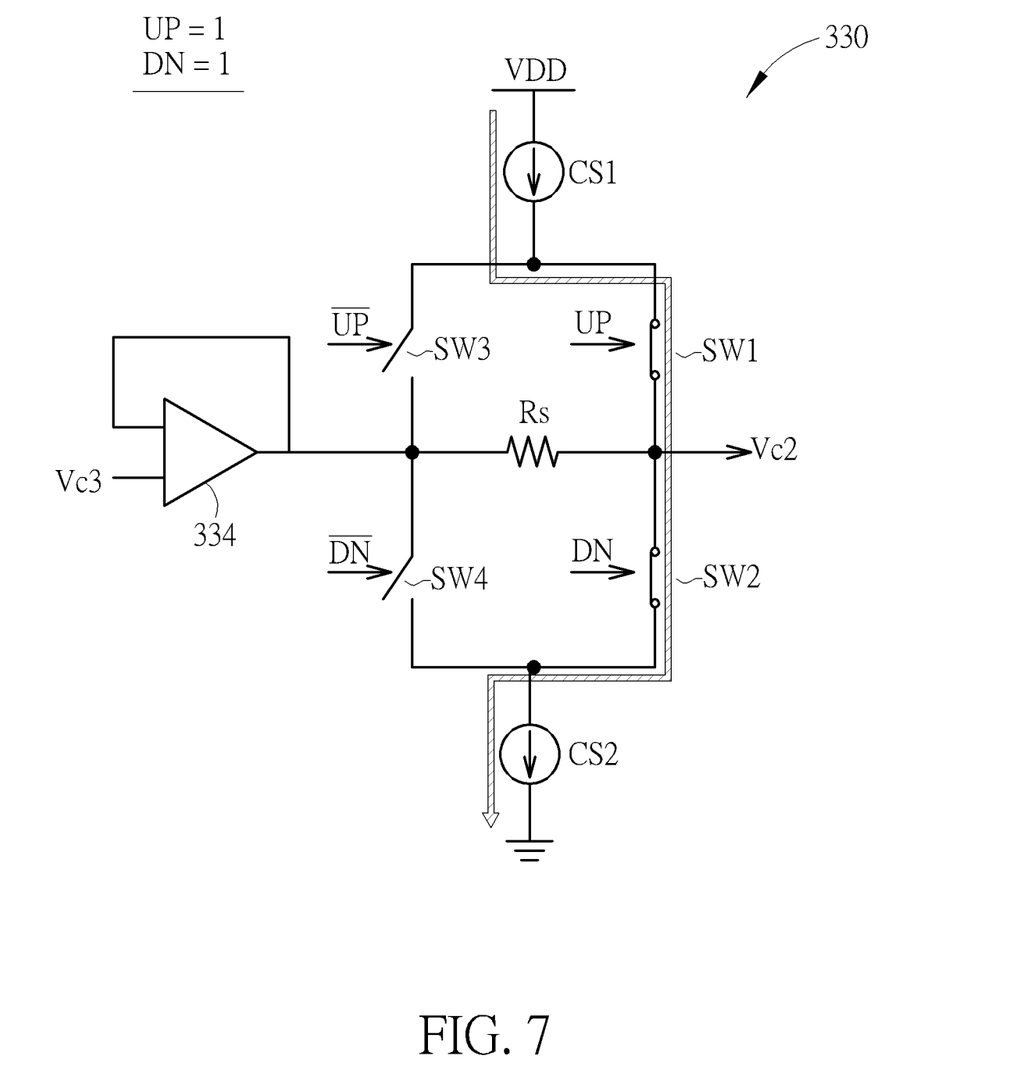
Figure 8:
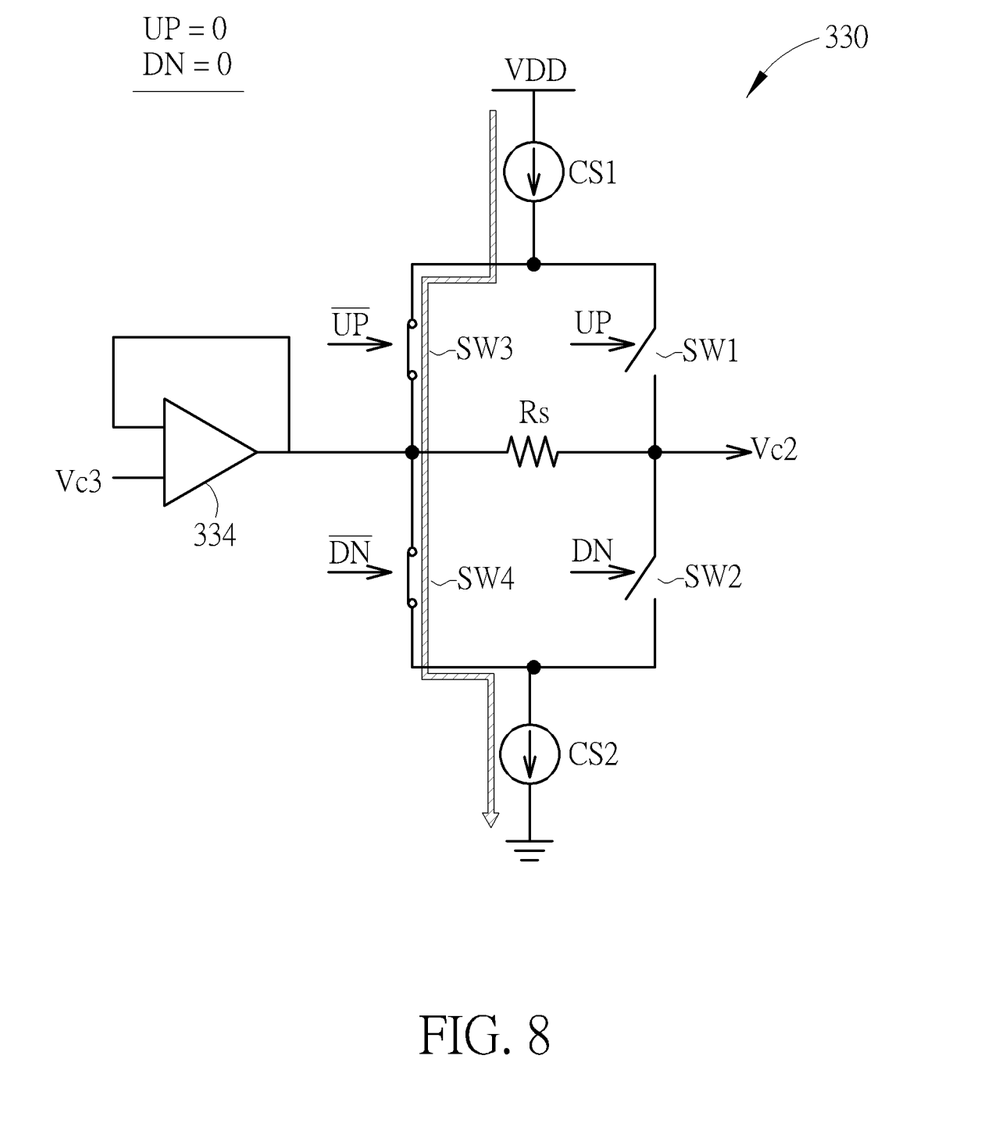

FIGS. 5-8 show current paths of the proportional path 330 when the up signal UP and down signal DN have different logical values. In FIG. 5, if the up signal UP is "0" and the down signal DN is "1", the switches SW1-SW4 are controlled to be off, on, on, and off, respectively, so the current generated by the current source CS1 flows through the switch SW3, the resistor Rs and the switch SW2, and flows into the current source CS2, and the output terminal of the buffer 334 is not influenced. In FIG. 6, if the up signal UP is "1" and the down signal DN is "0", the switches SW1-SW4 are controlled to be on, off, off, and on, respectively, so the current generated by the current source CS1 flows through the switch SW1, the resistor Rs and the switch SW4, and flows into the current source CS2, and the output terminal of the buffer 334 is not influenced. In FIG. 7, if the up signal UP is "1" and the down signal DN is "1", the switches SW1-SW4 are controlled to be on, on, off, and off, respectively, so the current generated by the current source CS1 flows through the switch SW1 and the switch SW2, and flows into the current source CS2, and the output terminal of the buffer 334 is not influenced. In FIG. 8, if the up signal UP is "0" and the down signal DN is "0", the switches SW1-SW4 are controlled to be off, off, on, and on, respectively, so the current generated by the current source CS1 flows through the switch SW3 and the switch SW4, and flows into the current source CS2, and the output terminal of the buffer 334 is not influenced.

It is noted that although a PLL is used as the clock generating circuit in the above embodiments, the present invention is not limited thereto. The concept of controlling the oscillator by using the control signals generated by three paths proposed by the present invention can also be applied to other clock generating circuits, such as a clock and data recovery (CDR) circuit. Since a person skilled in the art should understand the implementation of the clock data recovery circuit after reading the above embodiments, a detailed description is omitted here.

Briefly summarized, in the clock generating circuit of the present invention, the integral path, the proportional path and the bias path are designed to respectively generate the first control signal, the second control signal and the third control signal to control the operations of the oscillator. By using the third control signal generated by the bias path to control most of the gain of the oscillator, the impact of the external noise on the oscillator is greatly reduced. In addition, by separately setting the integral path and the proportional path, the designer has a higher degree of freedom for considering the gain of the voltage-controlled oscillator controlled by the integral path and the proportional path, the currents of the charge pumps within the integral path and the proportional path, and the design of the filter.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A clock generating circuit, comprising:
   a phase detector, for generating a detection result according to a reference signal and a feedback signal;
   an integral path comprising a first charge pump, wherein the first charge pump generates a first control signal according to the detection result;
   a proportional path comprising a second charge pump, wherein the second charge pump generates a second control signal according to the detection result;
   a bias path comprising a low-pass filter, wherein the low-pass filter directly receives the first control signal outputted by the first charge pump, and the low-pass filter filters the first control signal to filter out high frequency components and noise components within the first control signal to generate a third control signal, wherein the third control signal only comprises low-frequency components of the first control signal; and
   an oscillator, for generating a clock signal according to the first control signal, the second control signal and the third control signal.

2. The clock generating circuit of claim 1, wherein the proportional path generates a low-frequency component of the second control signal according to the third control signal.

3. The clock generating circuit of claim 1, wherein the oscillator is a voltage-controlled oscillator, and the voltage-controlled oscillator comprises:
   a first voltage-controlled current source;
   a second voltage-controlled current source; and
   a third voltage-controlled current source;
   wherein the first voltage-controlled current source, the second voltage-controlled current source and the third voltage-controlled current source are controlled by the first control signal, the second control signal and the third control signal, respectively, to make the voltage-controlled oscillator generate the clock signal.

4. The clock generating circuit of claim 3, wherein the third voltage-controlled current source contributes more to a gain of the voltage-controlled oscillator than the first voltage-controlled current source and the second voltage-controlled current source.

5. A clock generating circuit, comprising:
   a phase detector, for generating a detection result according to a reference signal and a feedback signal;
   an integral path comprising a first charge pump, wherein the first charge pump generates a first control signal according to the detection result;
   a proportional path comprising a second charge pump, wherein the second charge pump generates a second control signal according to the detection result;
   a bias path comprising a low-pass filter, wherein the low-pass filter filters the first control signal to generate a third control signal; and
   an oscillator, for generating a clock signal according to the first control signal, the second control signal and the third control signal;
   wherein the proportional path further comprises:
   a buffer, for receiving the third control signal to generate a buffered third control signal;
   a resistor having a first terminal and a second terminal, wherein the first terminal is coupled to an output terminal of the second charge pump, and the second terminal is coupled to an output terminal of the buffer; and
   a third charge pump, wherein an output terminal of the third charge pump is coupled to the second terminal of the resistor.

6. The clock generating circuit of claim 5, wherein the second charge pump and the third charge pump have different polarities.

7. The clock generating circuit of claim 6, wherein a current outputted by the second charge pump flows into the third charge pump through the resistor, or a current outputted by the third charge pump flows into the second charge pump through the resistor, to make the output terminal of the buffer be a virtual ground.

8. A method for generating a clock signal, comprising:
generating a detection result according to a reference signal and a feedback signal;
using a first charge pump to generate a first control signal according to the detection result;
using a second charge pump to generate a second control signal according to the detection result;
using a low-pass filter to directly receive the first control signal, and using the low-pass filter to filter the first control signal to filter out high frequency components and noise components within the first control signal to generate a third control signal, wherein the third control signal only comprises low-frequency components of the first control signal;
using the first control signal, the second control signal and the third control signal to control an oscillator to generate the clock signal.

9. The method of claim 8, further comprising:
generating a low frequency component of the second control signal according to the third control signal.

10. The method of claim 8, wherein the oscillator is a voltage-controlled oscillator, and the step of using the first control signal, the second control signal and the third control signal to control the oscillator to generate the clock signal comprises:
using the first control signal, the second control signal and the third control signal to control a first voltage-controlled current source, a second voltage-controlled current source and a third voltage-controlled current source, to make the voltage-controlled oscillator generate the clock signal.

* * * * *